United States Patent
Gregorius (10) Patent No.: US 8,031,539 B2
(45) Date of Patent: Oct. 4, 2011

(54) MEMORY DEVICE AND MEMORY SYSTEM COMPRISING A MEMORY DEVICE AND A MEMORY CONTROL DEVICE

(75) Inventor: Peter Gregorius, Munich (DE)

(73) Assignee: Qimonda AG, Munich (DE)

( * ) Notice: Subject to any disclaimer, the term of this patent is extended or adjusted under 35 U.S.C. 154(b) by 352 days.

(21) Appl. No.: 12/248,759

(22) Filed: Oct. 9, 2008

(65) Prior Publication Data

US 2010/0091588 A1    Apr. 15, 2010

(51) Int. Cl.
    *G11C 7/00* (2006.01)
(52) U.S. Cl. ............ 365/189.15; 365/233; 365/191
(58) Field of Classification Search ......... 365/189.15, 365/233, 191, 189.03, 189.17, 230.03, 205, 365/189.07, 189.05
    See application file for complete search history.

(56) References Cited

U.S. PATENT DOCUMENTS

| | | | |
|---|---|---|---|
| 6,718,275 B2 * | 4/2004 | Nagase et al. ................. 702/85 |
| 7,173,877 B2 * | 2/2007 | Ruckerbauer et al. ... 365/189.17 |
| 7,343,508 B2 * | 3/2008 | Khodorkovsky ............. 713/500 |
| 7,791,963 B2 * | 9/2010 | Shin ............................. 365/191 |
| 2002/0129215 A1 | 9/2002 | Yoo et al. |
| 2002/0161968 A1 | 10/2002 | Yoo et al. |
| 2006/0055473 A1 * | 3/2006 | Takayama .................. 331/57 |

OTHER PUBLICATIONS

"Qimonda GDDR5-White Paper Aug. 2007", pp. 1-10, Aug. 2007, <www.qimonda-news.com/download/Qimonda_GDDR5-whitepaper.pdf>.
Zheng Gu, Peter Gregorius, Daniel Kehrer, Lydia Neumann, Evelyn Neuscheler, Thomas Rickes, Hermann Ruckerbauer, Ralf Schledz, Martin Streibl, and Juergen Zielbauer, Cascading Techniques for a High-Speed Memory Interface, Digest of Technical Papers, IEEE International Solid-State Circuits Conference, 2007, ISSCC 2007, Feb. 13, 2007, pp. 234-599.
Brent Keeth, R. Jacob Baker, DRAM Circuit Design, A Tutorial, IEEE Press Series on Microelectronic Systems, ISBN 0780360141, Nov. 2000, pp. 142-153, Wiley-IEEE Press, New York.

* cited by examiner

*Primary Examiner* — Dang Nguyen
(74) *Attorney, Agent, or Firm* — Patterson & Sheridan, LLP (57) ABSTRACT

In an embodiment, a memory device comprises a clock generating unit being configured to generate a read clock signal, the clock generating unit being connected to a first clock signal contact configured to send the read clock signal, and the clock generating unit being connected to data signal contacts being configured to send data signals, the memory device being configured to send the data signals in a phase and frequency accurate (source synchronous) manner with regard to the read clock signal.

24 Claims, 7 Drawing Sheets

MEMORY DEVICE AND MEMORY SYSTEM COMPRISING A MEMORY DEVICE AND A MEMORY CONTROL DEVICE

BACKGROUND OF THE INVENTION

Memory devices comprising a plurality of memory cells which may be selectively addressed (random access memory) are nowadays used in many stationary and portable units in order to store information and read it out again. Current memory devices allowing for a high data transmission rate are optimized for the respective ambient conditions. For these memory devices, the focus is on guaranteeing high signal integrity via a fixed channel or a printed circuit board, respectively. In the case of high data transmission rates, these memory devices exhibit high power consumption. Moreover, very broad data interfaces are desirable in order to achieve high data transmission rates. Conventional memory devices are therefore not very appropriate for applications in which a low power consumption is a significant factor. In particular, existing memory devices are not optimized for mobile and portable appliances.

SUMMARY OF THE INVENTION

Embodiments of the present invention relate to a memory device and to a memory system comprising a memory device and a memory control device having a high data transmission rate and a low power consumption.

In an embodiment, a memory device comprises a clock generating unit configured to generate a read clock signal, the clock generating unit being connected to a first clock signal contact configured to send the read clock signal, and the clock generating unit being connected to a first data signal contact configured to send data signals, the memory device being configured to send the data signals in a phase and frequency accurate manner with regard to the read clock signal.

In a further embodiment, a memory system comprises a first memory device and a memory control device, the memory device comprising a clock generating unit configured to generate a read clock signal, the clock generating unit being connected to a first clock signal contact configured to send the read clock signal, and the clock generating unit being connected to a first data signal contact configured to send data signals, the memory control device comprising a second clock signal contact being connected to the first clock signal contact of the memory device and being configured to receive the read clock signal sent by the memory device, and a second data signal contact being connected to the first data signal contact of the memory device and being configured to receive the data signals sent by the memory device, the memory device being configured to send the data signals in a phase and frequency accurate manner with regard to the read clock signal, and the memory control device being configured to sense the data signals synchronously to the received read clock signals.

In a further embodiment, an electronic circuit comprises a first clock signal contact configured to receive a write clock signal, a first clock generating unit connected to the first clock signal contact and configured to process the write clock signal, and a first multiplexer unit with inputs connected to the first clock signal contact and to the output of the first clock generating unit, the first multiplexer unit being configured to select either the write clock signal or the output signal of the first clock generating unit.

In a further embodiment, an electronic circuit comprises a command and address signal contact for receiving a command and address signal, a repeater unit for processing the received command and address signal, and a repeater contact for forwarding the processed command and address signal to a further electronic circuit.

In a further embodiment, a method for performing a read access in a memory system comprises a memory device and a memory control device, the method comprising the steps of sending of a first clock signal from the memory control device to the memory device, generation of a read clock signal from the first clock signal by the memory device, sending of the read clock signal from the memory device to the memory control device, sending of a data signal that is frequency- and phase-synchronous to the read clock signal from the memory device to the memory control device.

BRIEF DESCRIPTION OF THE DRAWINGS

For a clearer understanding of the above-described features of the present invention, a more detailed description of the invention briefly summarized above may be had in the following in conjunction with embodiments, some of which are illustrated in the accompanying drawings. It is to be noted, however, that the accompanying drawings only show typical embodiments of the present invention and are therefore not limiting of its scope since the invention may admit other equally effective embodiments.

DETAILED DESCRIPTION

Several embodiments of the present invention will now be described in conjunction with the accompanying drawings, whereby the same reference numerals refer to the same elements.

The present invention may be described with regard to various functional components. It should be noted that several components may be coupled or connected to other components within examples of circuits in a suitable manner, and that such connections and couplings may be realized by directly connecting components and by connecting by means of other components and devices situated in between.

Figure 1:
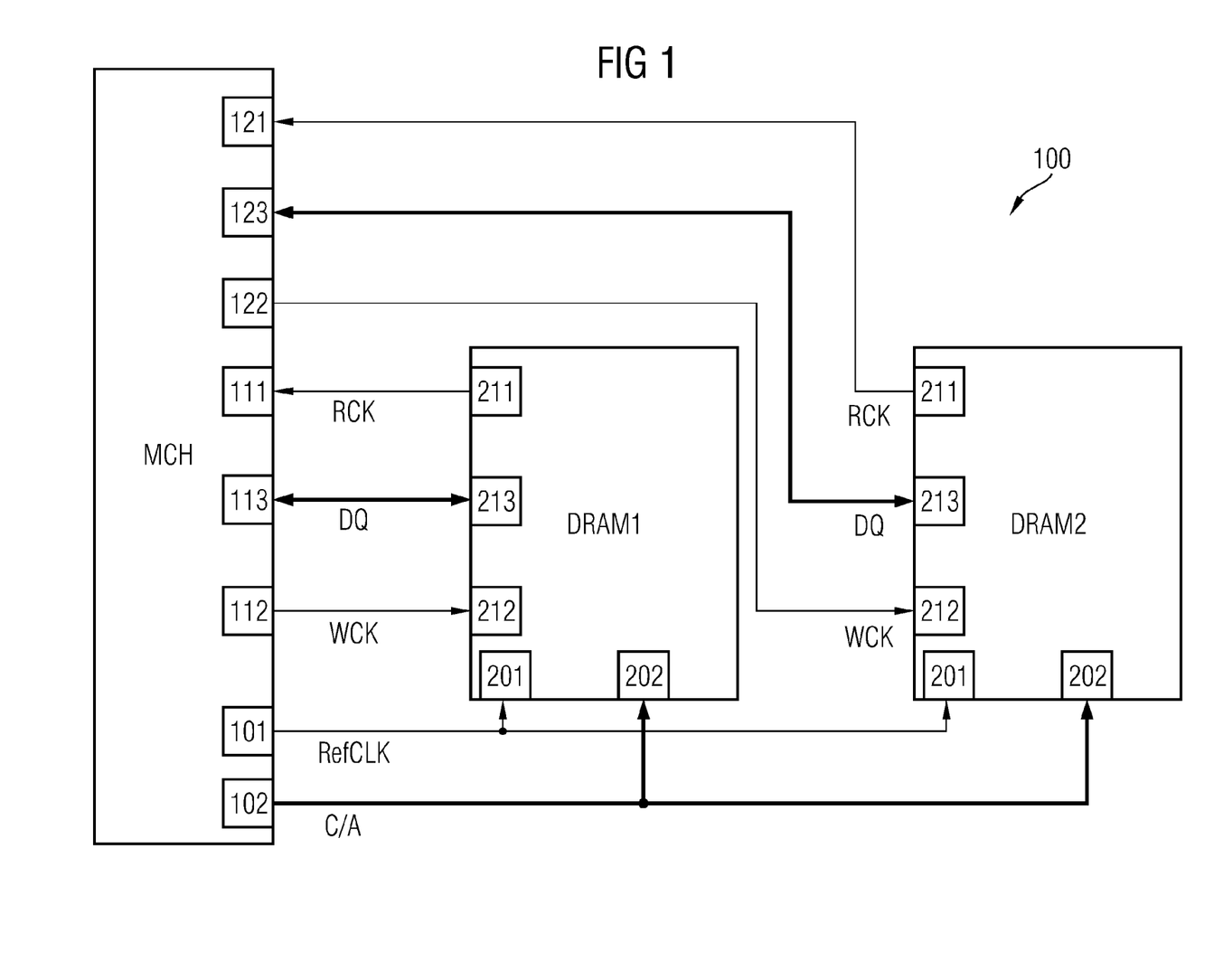
FIG. 1 shows a memory system comprising two memory devices, a memory control device, bidirectional data interfaces and a command and address bus configured as a fly-by bus.

FIG. 1 shows a schematic view of a memory system 100 comprising a memory control device MCH, a first memory device DRAM1 and a second memory device DRAM2. The memory control device MCH comprises a clock signal contact 101 provided for outputting a reference clock signal RefCLK. The first and the second memory component DRAM1, DRAM2 comprise one clock signal contact 201, respectively, which is provided for receiving the reference clock signal RefCLK. The clock signal contact 101 of the memory control device MCH is connected to the clock signal contacts 201 of the first and the second memory device DRAM1, DRAM2 via a signal line. Thereby, the signal line is configured as a so-called fly-by bus, i.e. as a signal rail from which the reference clock signal RefCLK is tapped by the first and the second memory device DRAM1, DRAM2.

The memory control device MCH comprises a command and address signal contact 102 which is provided for outputting a command and address signal C/A. The first and the second memory device DRAM1, DRAM2 each comprise a command and address signal contact 202 provided for receiving the command and address signal C/A. The command and address signal contact 102 of the memory control device MCH is connected to the command and address signal contacts 202 of the first and the second memory device DRAM1, DRAM2 via a plurality of signal lines configured as a fly-by bus. Thus, these signal lines are configured as signal rails from which the first and the second memory device DRAM1, DRAM2 tap the command and address signal C/A. The plurality of command and address signal lines may e.g. comprise 12 individual signal lines. However, it is also possible to use a different number of signal lines. One or more signal lines may be provided to indicate an inverted command and address signal on the other command and address signal lines.

The memory control device MCH may transmit commands and addresses in the form of a command and address signal C/A to the connected memory devices DRAM1, DRAM2 via the command and address signal contact 102. The memory control device MCH may output the command and address signal thereto e.g. in a frequency and phase synchronous (source synchronous) manner with regard to the reference clock signal RefCLK via the command and address signal contact 102. In other embodiments of the invention, the memory control device MCH may, however, also output the command and address signal C/A in a manner which is frequency and phase synchronous to a different clock signal.

The memory devices DRAM1, DRAM2 sense the received command and address signal C/A in a frequency and phase synchronous manner with regard to the received reference clock signal RefCLK. If the memory control device MCH is configured to output the command and address signal C/A in a manner which is frequency and phase synchronous with regard to a clock signal other than the reference clock signal RefCLK, the memory devices DRAM1, DRAM2 sense the received command and address signal C/A in a frequency and phase synchronous manner with regard to this other clock signal. In this manner, the memory devices DRAM1, DRAM2 may recover the commands and addresses sent by the memory control device MCH from the received command and address signal C/A.

The addresses and commands that are transmitted to the memory devices DRAM1, DRAM2 by the memory control device MCH may e.g. instruct the memory devices DRAM1, DRAM2 to initiate a read operation from a particular memory address. The commands and addresses that are transmitted to the memory devices DRAM1, DRAM2 by the memory control device MCH may e.g. also instruct the memory devices DRAM1, DRAM2 to start a write operation to a particular memory address. The memory control device MCH may also transmit any other commands and addresses to the memory devices DRAM1, DRAM2.

The memory control device MCH comprises a clock signal contact 111 which is provided for receiving a read clock signal RCK. The first memory device DRAM1 comprises a clock signal contact 211 which is provided for outputting a read clock signal RCK and which is connected to the clock signal contact 111 of the memory control device MCH via a signal line.

The memory control device MCH further comprises a clock signal contact 112 which is configured to output a write clock signal WCK. The first memory device DRAM1 comprises a clock signal contact 212 which is connected to the clock signal contact 112 of the memory control device MCH via a signal line. The clock signal contact 212 is configured to receive the write clock signal WCK output by the memory control device MCH.

The memory control device MCH comprises a data signal contact 113 provided for sending and receiving data signals DQ. The data signal contact 113 of the memory control device MCH is connected to a data signal contact 213 of the first memory device DRAM1 via a plurality of data signal lines. The data signal contact 213 of the first memory device DRAM1 serves to send and receive data signals DQ. The data signal contacts 113, 213 as well as the data signal lines are configured bidirectionally and allow for transmitting data from the memory control device MCH to the first memory device DRAM1 as well as from the first memory device DRAM1 to the memory control device MCH.

The plurality of data signal lines may e.g. comprise a number of individual data signal lines, the number being a multiple of eight. For example, the plurality of data signal lines may comprise 32 individual data signal lines. However, any other number of data signal lines may be provided. One or more signal lines may be provided to indicate an inverted data signal on the data signal lines.

The memory control device MCH comprises a further clock signal contact 121 for receiving a read clock signal RCK. Furthermore, the memory control device MCH comprises a further clock signal contact 122 for sending a write clock signal WCK. Moreover, the memory control device MCH comprises a further data signal contact 123 for sending and receiving data signals DQ. The clock signal contacts 121, 122 of the memory control device MCH correspond to clock signal contacts 111, 112 of the memory control device MCH in their function. The data signal contact 123 corresponds to the data signal contact 113 in its function.

The contacts 121, 122, 123 of the memory control device MCH are connected to contacts 211, 212, 213 of the second memory device DRAM2. The contacts 211, 212, 213 of the second memory device DRAM2 correspond to the contacts 211, 212, 213 of the first memory device DRAM1. The memory control device MCH may receive a read clock signal RCK sent by the second memory device DRAM2 via the clock signal contact 121. Via the clock signal contact 212, the second memory device DRAM2 may receive a write clock signal WCK sent by the memory control device MCH via the clock signal contact 122. Via the bidirectional data signal contacts 123, 213, which are connected to each other via a plurality of bidirectional data signal lines, data signals DQ may be sent to the second memory device DRAM2 by the memory control device MCH, or to the memory control device MCH by the second memory device DRAM2.

The memory system 100 schematically illustrated in FIG. 1 may comprise further memory devices in addition to the first and the second memory devices DRAM1, DRAM2. In this case, the memory control device MCH comprises an additional clock signal contact for each further memory device for receiving a read clock signal RCK, which is connected to the clock signal contact 211 of the additional memory device. Furthermore, the memory control device MCH comprises an additional clock signal contact for each further memory device for sending a write clock signal WCK, which is connected to the clock signal contact 212 of the additional memory device. Furthermore, the memory control device MCH comprises a further data signal contact for each additional memory device for sending and receiving data signals DQ, the further data signal contact being connected to the data signal contact 213 of the additional memory device via a plurality of data signal lines. Furthermore, the clock signal contact 201 of each additional memory device is connected to the clock signal contact 201 of the memory control device MCH for receiving a reference clock signal RefCLK via the clock signal line configured as fly-by bus. Furthermore, the command and address signal contact 202 of each further memory device is connected to the command and address signal contact 102 of the memory control device MCH via the command and address signal line configured as a fly-by bus. The memory system 100 schematically shown in FIG. 1 may e.g. comprise eight memory devices. However, any other number of memory devices is also conceivable.

In order to store data in the first memory device DRAM1, they may be transmitted from the memory control device MCH to the first memory device DRAM1 in a write operation. For this purpose, the memory control device MCH outputs the data to be written as data signal DQ to the plurality of data signal lines via the data signal contact 113. The memory control device MCH thereby outputs the data to be written in a frequency and phase synchronous (source synchronous) manner with regard to the write clock signal via the data signal contact 113. In parallel thereto, the memory control device MCH outputs the write clock signal WCK via the clock signal contact 112. The first memory device DRAM1 receives the write clock signal WCK sent by the memory control device MCH via the clock signal contact 212. Simultaneously, the first memory device DRAM1 receives the data signal DQ sent by the memory control device MCH via its data signal contact 213.

The first memory device DRAM1 senses the received data signal DQ in a frequency and phase synchronous (source synchronous) manner with regard to the received write clock signal WCK. The memory control device MCH has previously regenerated the data signal DQ to the write clock signal WCK in a frequency and phase synchronous manner. The data signal DQ and the write clock signal WCH have both been transmitted from the memory control device MCH to the first memory device DRAM1. For this reason, the write clock signal WCK and the data signal DQ still have a high synchronicity to each other even after receipt by the first memory device DRAM1. Thus, it is possible for the first memory device DRAM1 to reconstruct the data to be written to the memory cells of the first memory device DRAM1 from the data signal DQ with a very low failure rate.

If data is to be written into the second memory device DRAM2, it may be transmitted from the memory control device MCH to the second memory device DRAM2. Therefore, the memory control device MCH outputs the data to be stored in the second memory device DRAM2 in a frequency and phase synchronous manner with regard to the write clock signal WCK via the data signal contact 123. Additionally, the memory control device MCH outputs the write clock signal WCK via the clock signal contact 122. The second memory device DRAM2 receives the clock signal WCK to be output by the memory control device MCH via the clock signal contact 212. In addition, the second memory device DRAM2 receives the data signal DQ to be output by the memory control device MCH via the data signal contact 213 and senses the data signal DQ in a frequency and phase synchronous manner with regard to the write clock signal WCK. Thereby, the second memory device DRAM2 may reconstruct the data to be stored in the second memory device DRAM2 from the data signal DQ with a low bit failure rate.

In order to transmit data from the first memory device DRAM1 to the memory control device MCH during a read operation, the first memory device DRAM1 outputs the data to be transmitted in a frequency and phase synchronous manner with regard to the read clock signal RCK to the connected data signal lines via the data signal contact 213. Additionally, the first memory device DRAM1 outputs the read clock signal RCK via the clock signal contact 211. The memory control device MCH receives the read clock signal RCK sent by the first memory device DRAM1 via the clock signal contact 111. Furthermore, the memory control device MCH outputs the data signal DQ sent by the first memory device DRAM1 via the data signal contact 113.

The memory control device MCH senses the received data signal DQ frequency- and phase-synchronously to the received read clock signal. The first memory device DRAM1 has previously generated the data signal DQ frequency- and phase-synchronously to the read clock signal RCK. The data signal DQ and the read clock signal RCK have both been transmitted from the first memory device DRAM1 to the memory control device MCH. For this reason, the read clock signal RCK and the data signal DQ still show a high synchronicity to each other even after receipt by the memory control device MCH. Thereby, the memory control device MCH is able to reconstruct the data sent by the first memory device DRAM1 from the data signal DQ with only a very low bit failure rate.

Data may be transmitted from the second memory device DRAM2 to the memory control device MCH during a read operation.

To this end, the second memory device DRAM2 may output the data to be transmitted frequency- and phase-synchronously to the read clock signal RCK via the data signal contact 213 of the second memory device DRAM2 as data signal DQ. Additionally, the second memory device DRAM2 outputs the read clock signal RCK via its clock signal contact 211. The memory control device MCH receives the read clock signal RCK output by the second memory device DRAM2 via its clock signal contact 122. In addition, the memory control device MCH receives the data signal DQ output by the second memory device DRAM2 via its data signal contact 123. The memory control device MCH senses the received data signal DQ frequency- and phase-synchronously to the received read clock signal RCK and is thus able to reconstruct the data transmitted by the second memory device DRAM2 with a very low failure rate.

In the described embodiment, the data signal contacts 113, 123 of the memory control device MCH, the data signal contacts 213 of the memory devices DRAM1, DRAM2 and the plurality of data signal lines situated between the respective data signal contacts are arranged bidirectionally. This means that the same data signal contacts and data signal lines are provided and configured to transmit data in the direction from the memory control device MCH to one of the memory devices DRAM1, DRAM2, as well as in the direction of one of the memory devices DRAM1, DRAM2 to the memory control device MCH. Accordingly, the memory system 100 will sufficiently work even with a small number of data signal lines between the memory control device MCH and the memory devices DRAM1, DRAM2.

In the read case, the memory devices DRAM1, DRAM2 output the data to be transmitted to the memory control device MCH in a frequency and phase accurate manner (source synchronous) with regard to the read clock signal RCK. Additionally, the memory devices DRAM1, DRAM2 output the read clock signal RCK. The memory devices DRAM1, DRAM2 may generate the read clock signal RCK from the received write clock signal WCK or from the received reference clock signal RefCLK, as schematically illustrated in FIG. 2.

Figure 2:
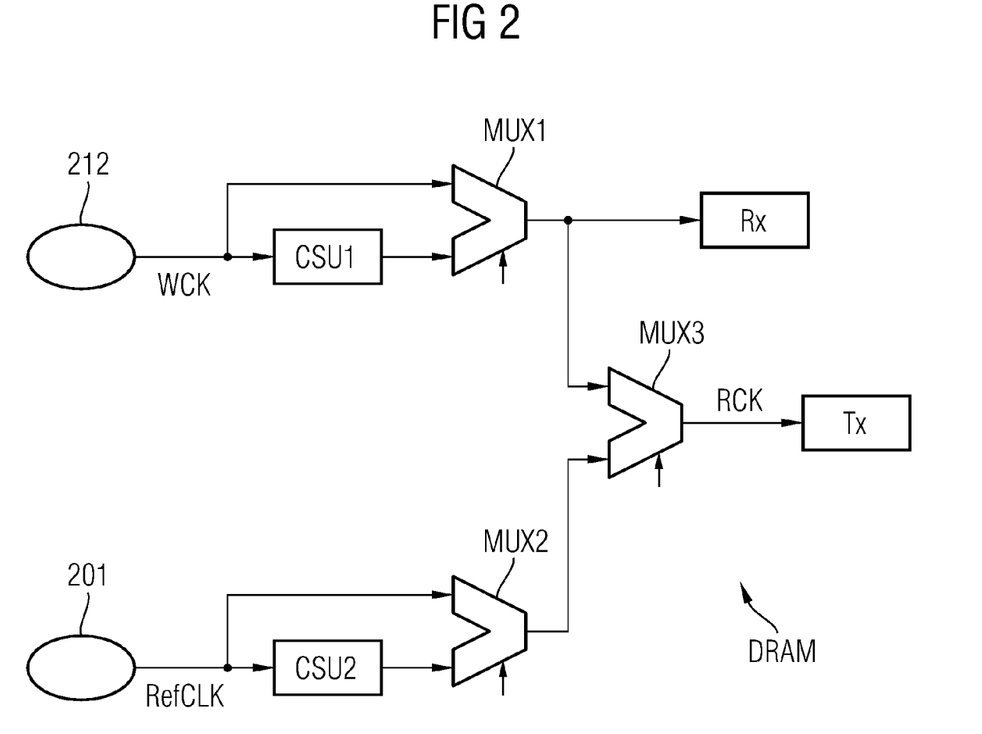
FIG. 2 shows a schematic view of a section of a clock tree in an inventive memory device.

FIG. 2 shows a schematic view of a section of the memory device DRAM. The memory device DRAM comprises a first clock signal contact 212 through which the memory device DRAM may receive a write clock signal WCK. Moreover, the memory device DRAM comprises a second clock signal contact 201 through which the memory device DRAM may receive a reference clock signal RefCLK. The received write clock signal WCK is guided to a first clock generating unit CSU1. The first clock generating unit CSU1 is adapted to regenerate a write clock signal WCK. In addition, the clock generating unit CSU1 may filter out a noise signal overlaying the write clock signal WCK. The clock generating unit CSU1 may for this purpose be configured as a phase locked loop (PLL). The clock generating unit CSU1 may also be configured as a delay locked loop (DLL). The clock generating unit CSU1 may also comprise a filter circuit. The clock generating unit CSU1 may also comprise other subassemblies which the skilled person considers as suitable for regenerating the write clock signal WCK provided to the clock generating unit CSU1.

The clock signal regenerated by the first clock generating unit CSU1 is handed over to a first multiplexer MUX1. By means of the first multiplexer MUX1, either the clock signal regenerated by the clock generating unit CSU1 or the write clock signal WCK received by the clock signal contact 212 and not subjected to regeneration may be selected. The non-regenerated clock signal WCK may be selected if the non-regenerated clock signal already comprises sufficient signal quality. The clock signal regenerated from the first clock generating unit CSU1 may be selected if the non-regenerated clock signal WCK does not have sufficient signal quality. In a simplified embodiment of the invention, use is always made of the clock signal regenerated by the first clock generating unit CSU1. In this embodiment, the first multiplexer MUX1 may be omitted. In a different simplified embodiment of the invention, use is always made of the non-regenerated clock signal WCK. In this embodiment, the first clock generating unit CSU1 and the first multiplexer MUX1 may be omitted.

The clock signal output by the first multiplexer MUX1 is now handed over to a data receiving unit Rx. In the data receiving unit Rx of the memory device DRAM, the regenerated write clock signal WCK is used in order to sense a data signal DQ received by the data signal contact 213 of the memory cell DRAM in a frequency and phase synchronous manner.

The memory cell DRAM may receive a reference clock signal RefCLK via the clock signal contact 201. The memory cell DRAM forwards the received reference clock signal RefCLK to a second clock generating unit CSU2. The second clock generating unit CSU2 regenerates the reference clock signal RefCLK provided to it. Furthermore, the second clock generating unit CSU2 may filter out a noise signal overlying the reference clock signal RefCLK. Moreover, the second clock generating unit CSU2 may be configured to increase the frequency of the reference clock signal RefCLK provided to it, e.g. in order to multiply it by an integer factor. The second clock generating unit CSU2 may be configured as a phase locked loop (PLL), as a delay locked loop (DLL) or as a filter circuit. The second clock generating CSU2 may also comprise different components which the skilled person would use for regenerating the reference clock signal RefCLK.

The second clock generating unit CSU2 transfers the regenerated clock signal to a second multiplexer MUX2. The second multiplexer MUX2 allows for selecting either the non-regenerated reference clock signal RefCLK received by the clock signal contact 201 or the clock signal regenerated by the second clock generating unit CSU2. According to further embodiments, the selection multiplexer MUX2 may be omitted. Moreover, according to still a further embodiment of the invention, the second clock generating unit CSU2 and the multiplexer MUX2 may be omitted.

The clock signal selected by means of the first multiplexer MUX1 and the clock signal selected by means of the second multiplexer MUX2 are delivered to a third multiplexer MUX3. Thus, the third multiplexer MUX3 may receive one of the unchanged write clock signal WCK and the regenerated write clock signal and one of the non-regenerated reference clock signal RefCLK and the regenerated reference clock signal. One of the two clock signals provided to the third multiplexer MUX3 may be selected by the third multiplexer MUX3. The clock signal selected by means of the third multiplexer MUX3 is used in successive circuit parts of the memory device DRAM as a read clock signal RCK. For this purpose, the third multiplexer MUX3 hands over the read clock signal RCK selected by it to a data transmitting unit Tx. In the data transmitting unit Tx, the data to be transmitted from the memory device DRAM to the memory control device MCH in the read case are output in a frequency and phase accurate manner with regard to the read clock signal RCK via the data signal contact 213 of the memory device DRAM. In parallel thereto, the data transmitting unit Tx outputs the read clock signal RCK via the clock signal contact 211 of the memory device DRAM.

As is shown in FIG. 2 the memory device DRAM may derive the read clock signal RCK from the received write signal WCK or from the received reference clock signal RefCLK. The write clock signal WCK has the same frequency as the read clock signal RCK to be generated. Accordingly, the first clock generating unit CSU1 may not need to perform a frequency multiplication in order to generate the read clock signal RCK from the write clock signal WCK. However, the write clock signal may comprise a relatively high frequency, the handling of which is complex. The reference clock signal RefCLK may have a lower frequency than the read clock signal RCK to be generated. In this case, the second clock generating unit CSU2 may perform a frequency multiplication of the reference clock signal RefCLK. Accordingly, the second clock generating unit CSU2 may be implemented in a more complex manner having a higher power consumption. However, the reference clock signal is easier to handle due to its lower frequency. The frequency of the write clock signal may e.g. amount to two GHz. The frequency of the read clock signal may then amount to two GHz, as well. Between the memory device DRAM and the memory control device MCH, e.g. four Gb/s of data per data signal line may be transmitted. In a different embodiment of the invention, eight Gb/s of data per data signal line may be transmitted. The frequency of the reference clock signal RefCLK may e.g. be 1 GHz.

In a simplified embodiment of the invention, the read clock signal RCK is always generated from the write clock signal WCK. In another simplified embodiment of the invention, the read clock signal RCK is always generated from the reference clock signal RefCLK. In these embodiments, the third multiplexer MUX3 may be omitted.

Figure 3:
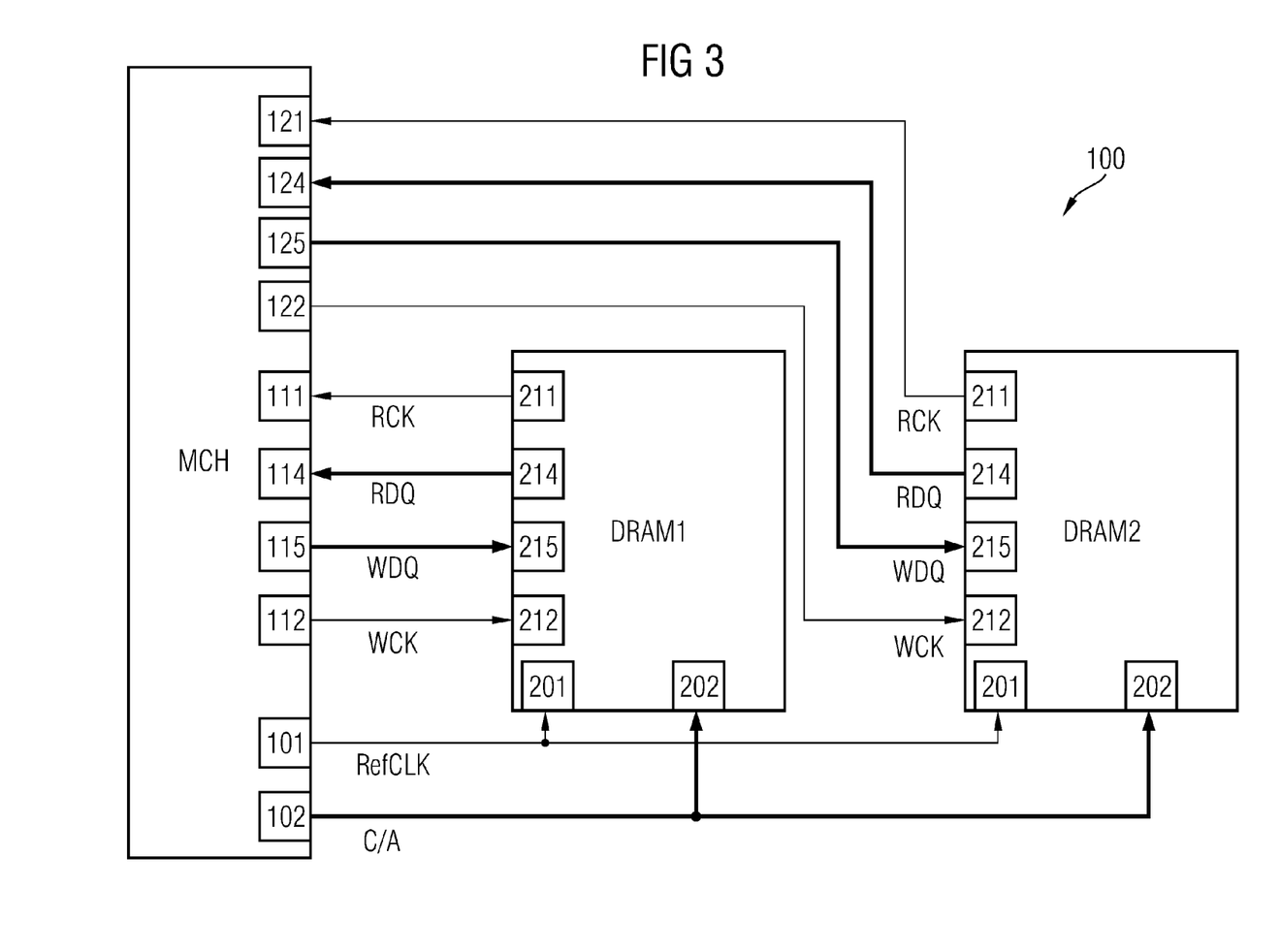
FIG. 3 shows a memory system comprising two memory devices, a memory control device, unidirectional data interfaces and a command and address bus configured as a fly-by bus.

FIG. 3 shows a further embodiment of a memory system 100. The memory system 100 comprises a memory control device MCH and a plurality of memory devices, two memory devices DRAM1, DRAM2 of which are shown. Contrary to the embodiment shown in FIG. 1, the memory control device MCH of the embodiment of FIG. 3 comprises two data signal contacts 114, 115. The data signal contact 114 is provided for receiving a read data signal RDQ. The data signal contact 115 of the memory control device MCH is provided for sending a write data signal WDQ. The first memory device DRAM1 also comprises two data signal contacts 214, 215. The data signal contact 214 of the memory device DRAM1 is provided for sending a read data signal RDQ. The data signal contact 215 of the memory device DRAM1 is provided for receiving a write data signal WDQ. The data signal contact 214 is connected to the data signal contact 114 of the memory control device MCH via a plurality of data signal lines. The data signal contact 215 of the memory device DRAM1 is connected to the data signal contact 115 of the memory control device MCH via a further plurality of data signal lines. In this embodiment of the invention, the data signal contacts 114, 115 of the memory control device MCH, the data signal contacts 214, 215 of the memory device DRAM1 and the plurality of data signal lines are configured unidirectionally, thus being merely provided for data transmission in one predetermined direction. The data signal contact 114 of the memory control device MCH, the data signal contact 214 of the first memory device DRAM1 and the intermediate data signal lines are provided for transmitting a read data signal RDQ from the first memory device DRAM1 to the memory control device MCH. The data signal contact 115 of the memory control device MCH, the data signal contact 215 of the first memory device DRAM1 and the intermediate data signal lines are provided for transmitting a write data signal WDQ from the memory control device MCH to the first memory device DRAM1.

The unidirectional configuration of the data signal contacts and data signal lines in this embodiment of the memory system 100 allows for simultaneous transmission of a write data signal WDQ from the memory control device MCH to the first memory device DRAM1 and of a read data signal RDQ form the first memory device DRAM1 to the memory control device MCH. Accordingly, this embodiment also allows for simultaneous transmission of read and write data signals RDQ, WQD between the memory control device MCH and the second memory device DRAM2. However, this embodiment may require a larger number of data signal lines.

The first memory device DRAM1 outputs the read data signal RDQ frequency- and phase-synchronously to the read clock signal RCK via the data signal contact 214. Moreover, the first memory device outputs the read clock signal RCK via the clock signal contact 211.

The memory control device MCH receives the read clock signal via the clock signal contact 111. Moreover, the memory control device MCH receives the read data signal RDQ via the data signal contact 114. The memory control device MCH senses the received read data signal RDQ frequency- and phase synchronously to the received read clock signal RCK and is thereby able to reconstruct the data sent from the first memory device DRAM1.

The memory control device MCH outputs the write data signal WDQ in a frequency and phase synchronous manner to the write clock signal WCK via the data signal contact 115. Moreover, the memory control device MCH outputs the write clock signal WCK via the clock signal contact 112. The first memory device DRAM1 receives the write clock signal WCK via the clock signal contact 212. Furthermore, the first memory device DRAM1 receives the write data signal WDQ via the data signal contact 215. The first memory device DRAM1 senses the received write data signal WDQ frequency- and phase-synchronously to the received write clock signal WCK in order to reconstruct the data transmitted by the memory control device MCH.

The memory device DRAM2 also comprises two data signal contacts 214, 215 being connected to two further data signal contacts 124, 125 of the memory control device MCH. The data transmission between the memory control device MCH and the second memory device DRAM2 is performed in analogy to the above-described data transmission between the memory control device MCH and the first memory device DRAM1.

Figure 4:
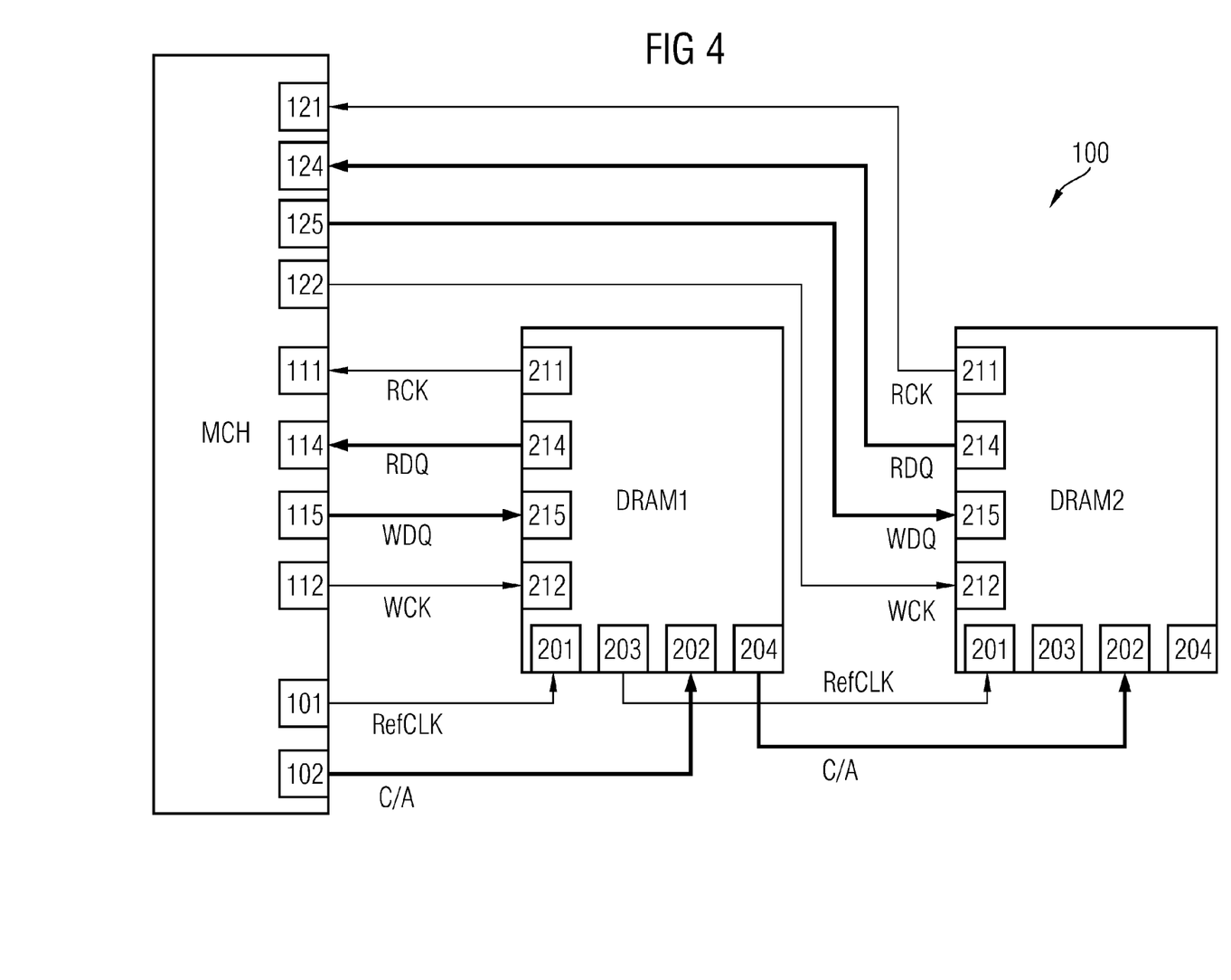
FIG. 4 shows a memory system comprising two memory devices, a memory control device, unidirectional data interfaces and a command and address bus having repeater functionality.

FIG. 4 shows a further embodiment of a memory system 100. The memory system 100 comprises a memory control device MCH and a plurality of memory devices, two memory devices DRAM1, DRAM2 of which are shown. As in the embodiment of FIG. 3, the memory devices DRAM1, DRAM2 are connected to the memory control device MCH via unidirectional data signal contacts and data signal lines.

In contrast to the embodiment examples of FIGS. 1 and 3, the clock signal lines for transmitting the reference clock signal RefCLK and the several command and address signal lines for transmitting the command and address signal C/A of FIG. 4 are not configured as a fly-by bus. The memory control device MCH comprises a clock signal contact 101 that is configured to output the reference clock signal RefCLK. The clock signal contact 101 of the memory control device MCH is connected to a clock signal contact 201 of the first memory device DRAM1 via a clock signal line. The first memory device DRAM1 receives the reference clock signal RefCLK output by the memory control device MCH via the clock signal contact 201. The first memory device DRAM1 regenerates the received reference clock signal RefCLK and subsequently outputs it via a further clock signal contact 203. The clock signal contact 203 of the first memory device DRAM1 is connected to a clock signal contact 201 of the second memory device DRAM2 via a further clock signal line. The second memory device DRAM2 receives the reference clock signal RefCLK output by the first memory device DRAM1 via its clock signal contact 201. Subsequently, the second memory device DRAM 2 regenerates the reference clock signal RefCLK received via its clock signal contact 201 und outputs it via a further clock signal contact 203. If the memory system 100 comprises further memory devices, the reference clock signal RefCLK output by the second memory device DRAM2 via its clock signal contact 203 is now provided to the next memory device of the memory system 100. The reference clock signal RefCLK is thus forwarded from one memory device to the next in the form of a daisy chain.

Figure 5:
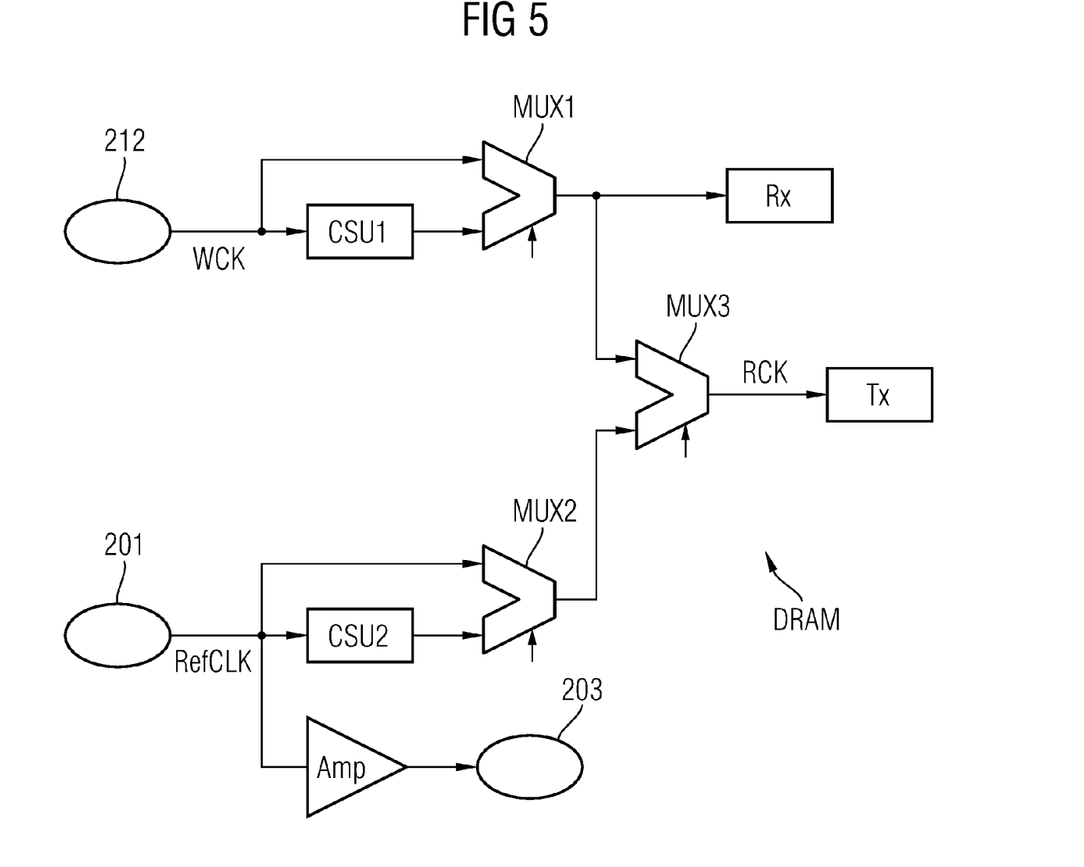
FIG. 5 shows a schematic view of a section of a clock tree in an inventive memory device.

Each of the memory devices of the memory system 100 regenerates the reference clock signal RefCLK between the receipt by the clock signal contact 201 and the forwarding by the clock signal contact 203, as is schematically shown in FIG. 5. Apart from the elements already known from FIG. 2 of the clock tree depicted in FIG. 5, which serve to generate the read clock signal RCK from the write clock signal WCK or the reference clock signal RefCLK, in addition, the regeneration of the reference clock signal RefCLK for outputting via the clock signal contact 203 is schematically depicted. Each memory device DRAM guides the reference clock signal RefCLK received via the clock signal contact 201 over a clock regenerating unit AMP. The clock regenerating unit AMP may e.g. comprise an amplifier. The clock regenerating unit AMP may also comprise other subassemblies which the skilled person deems suitable for regenerating the reference clock signal RefCLK. Subsequently, the memory device DRAM guides the reference clock signal RefCLK regenerated by the clock regenerating unit AMP to its clock signal contact 203 in order to hand it over to the next memory device DRAM in the daisy chain of the memory system 100.

In the embodiment of FIG. 4, the command and address signal C/A is also handed over from one memory device to the next in the form of a daisy chain. The memory control device MCH outputs the command and address signal C/A over the command and address signal contact 102 on a plurality of command and address lines. The first memory device DRAM1 receives the command and address signal C/A output by the memory control device MCH over its command and address signal contact 202. The first memory device DRAM1 regenerates the received command and address signal C/A and subsequently outputs it over a second command and address signal contact 204, from where it is forwarded to a command and address signal contact 202 of the second memory device DRAM2. The second memory device DRAM2 again regenerates the received command and address signal C/A and forwards it to the next memory device in the chain of memory devices of the memory system 100 over its second command and address signal contact 204.

Figure 6:
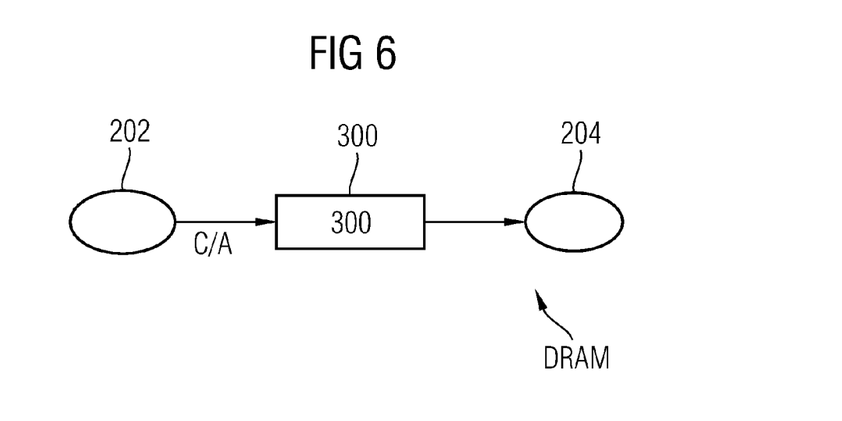
FIG. 6 shows a schematic view of a repeater functionality in an inventive memory device.

FIG. 6 schematically shows the regeneration of the command and address signal C/A carried out between the receipt of the command and address signal C/A and its forwarding to the successive memory device of each of the memory devices of the memory system 100. The memory device DRAM receives the command and address signal C/A via the command and address signal contact 202 and forwards it to a repeater 300. The repeater 300 regenerates the command and address signal C/A and forwards it to a command and address signal contact 204 from where the command and address signal C/A is transferred to the next memory device DRAM. The skilled person is aware of several possibilities of realizing the repeater 300 for regenerating the command and address signal C/A. The repeater 300 may regenerate the command and address signal C/A e.g. by means of flip-flops without buffering it. However, the repeater 300 may also buffer the command and address signal C/A in a FIFO (first in first out) queue. It is also possible to configure the repeater 300 transparently by means of an amplifier. In the simplest embodiment, the repeater 300 only comprises a conductor part. The skilled person is additionally aware of further possibilities of regenerating the command and address signal C/A.

The embodiment of the memory system 100 depicted in FIG. 4 comprising the chain-like forwarding of the reference clock signal RefCLK and of the command and address signal C/A from one memory device to the next allows for a high clock frequency of the reference clock signal RefCLK and for a high data transmission rate of the command and address signal C/A. In the variant of the memory system 100 shown in FIGS. 1 and 3 comprising signal rails configured as a fly-by bus, from which the individual memory devices tap the reference clock signal RefCLK and the command and address signal C/A, an increase of the number of connected memory devices leads to an increase of the electrical load at the reference clock signal line and at the command and address signal lines. This increase of the electrical load limits the maximally possible frequency and data transmission rate. On the other hand, the embodiment depicted in FIG. 4 of the memory system 100 with the daisy chain-like forwarding of the reference clock signal RefCLK and of the command and address signal C/A from one memory device to the next allows for a higher clock frequency of the reference clock signal RefCLK and for a higher data transmission rate of the command and address signal C/A, independently from the number of connected memory devices. The reference clock signal may e.g. comprise a frequency of 500 MHz.

Figure 7:
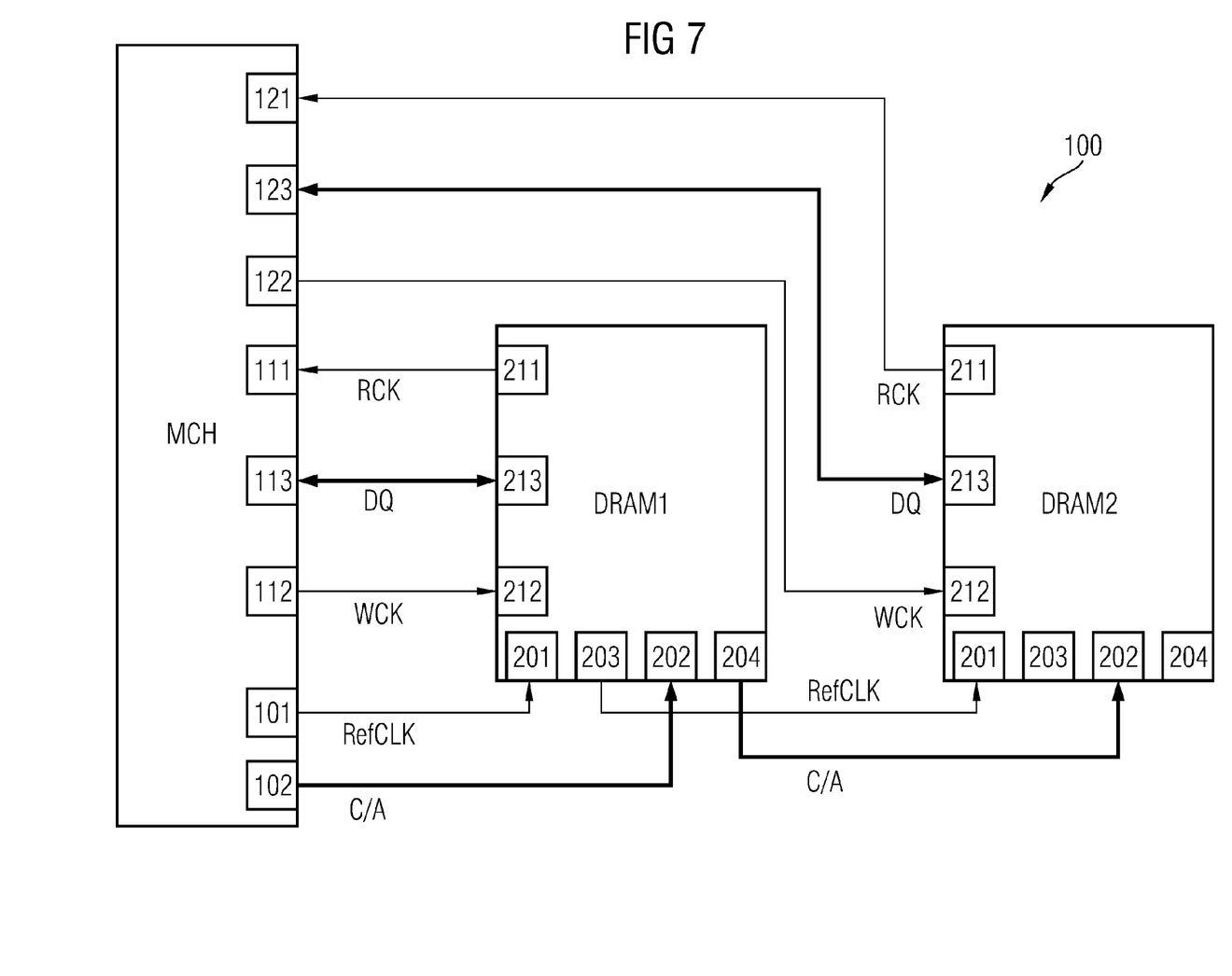
FIG. 7 shows a memory system comprising two memory devices, a memory control device, bidirectional data interfaces and a command and address bus having repeater functionality.

FIG. 7 shows a further embodiment of an memory system 100 comprising a memory control device MCH and a plurality of memory devices DRAM1, DRAM2. In this embodiment the reference clock signal RefCLK and the command and address signal C/A are transferred from one memory device to the next in a daisy chain, similar as has been described above with reference to FIG. 4. Moreover, in this embodiment the data signal contacts of the memory control device MCH and of the memory devices DRAM1, DRAM2 as well as the data signal lines are configured bidirectionally, as in the embodiment example of FIG. 1. The functionality of the memory system 100 depicted in FIG. 7 is in analogy to the description of the embodiment examples of FIGS. 1 and 4.

In a further embodiment (not depicted), the clock signal line of the reference clock signal RefCLK is configured as fly-by bus as in FIG. 1. In this embodiment, the command and address signal lines for transmitting the command and address signals C/A are, however, configured as a daisy chain from one memory device to the next, as shown in FIG. 4.

In a further embodiment (also not depicted), the command and address signal lines for transmitting the command and address signals C/A as fly-by bus are configured as depicted in the embodiment example of FIG. 1. In this embodiment, the clock signal line forms a daisy chain from one memory device to the next for transmitting the reference clock signal RefCLK, as depicted in FIG. 4.

In further embodiments of the invention, which are not depicted, the memory devices DRAM are divided up into two or more groups. In this embodiment, the memory control device MCH comprises several clock signal contacts for outputting the reference clock signal RefCLK and/or several command and address signal contacts for outputting the command and address signal C/A. The number of clock signal contacts and/or command and address signal contacts corresponds to the number of groups of memory devices. Each group of memory devices is connected to a clock signal contact of its own and/or to a command and address signal contact of the memory control device MCH in the form of a daisy chain and/or via a fly-by bus. The individual groups of memory devices are thus arranged in parallel to each other at the memory control device MCH.

The memory device described above may, for example, be used for applications requiring low power consumption and high data rates. The memory device may, for example, be used in a mobile or portable device, such as a mobile phone, a personal digital assistant, a navigation system, or a portable computer. Such device may comprise a microprocessor provided to access data stored in the memory device.

Figure 8:
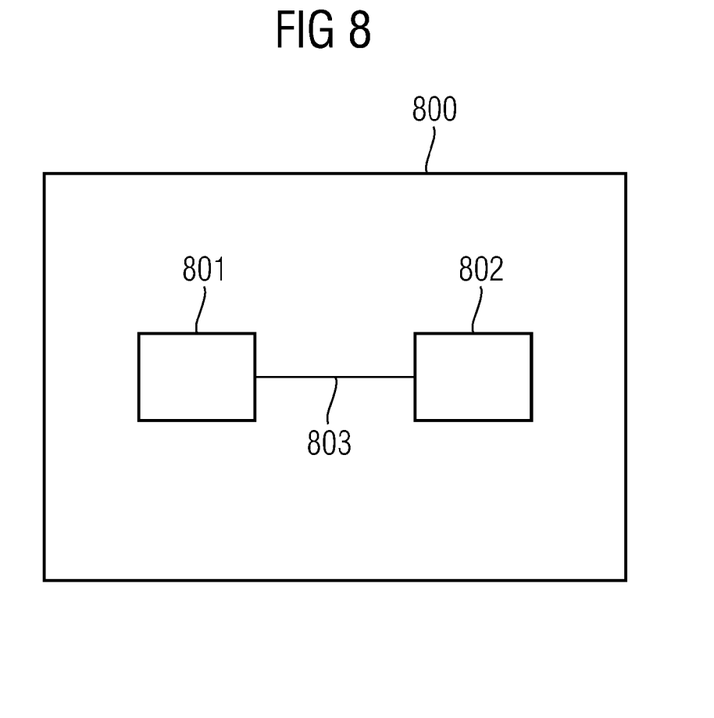
FIG. 8 shows a block diagram of a mobile device with a microprocessor and a memory device.

FIG. 8 is a block diagram of a mobile device 800 in accordance with an embodiment of the present invention. The mobile device 800 comprises a microprocessor 801 and a memory device 802 as described above. The microprocessor 801 is coupled to the memory device 802 by means of a coupler 803. The coupler 803 may comprise a memory controller. The microprocessor 801 may be configured to store data in the memory device 802. The microprocessor 801 may also be configured to retrieve data stored in the memory device 802. The mobile device 800 may comprise further components not shown in FIG. 8. The mobile device 800 may for example comprise a display, one or more buttons, a loudspeaker and other components. The mobile device 800 may as well comprise one or more connectors or interfaces to connect the mobile device 800 to other devices.

In another embodiment, the memory device may be applied as graphics memory in a portable or non-portable device. In this embodiment the device may comprise a graphics processing unit provided to access data stored in the memory device.

Figure 9:
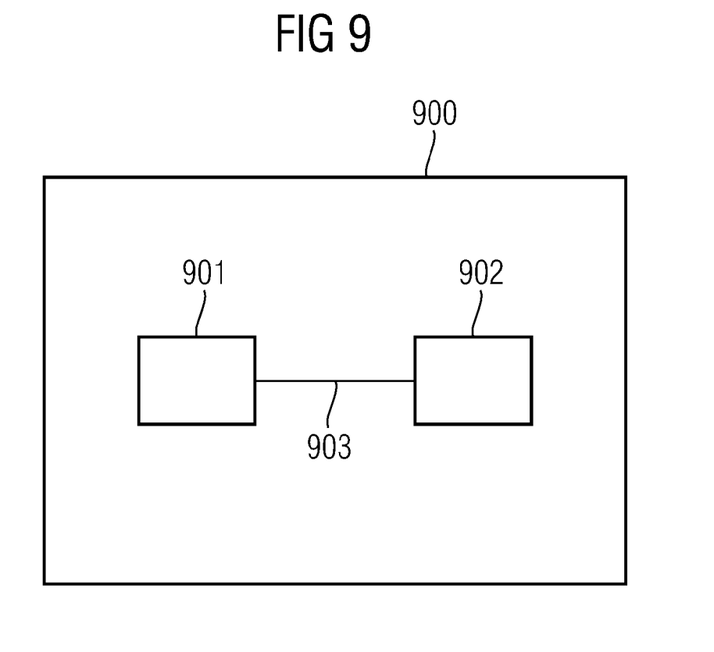
FIG. 9 shows a block diagram of a device with a graphics processing unit and a memory device.

FIG. 9 is a block diagram of a device 900 in accordance with an embodiment of the present invention. The device 900 comprises a graphics processing unit 901 and a memory device 902 as described above. The graphics processing unit 901 may be configured to produce a video signal. The graphics processing unit 901 is coupled to the memory device 902 by means of a coupler 903. The coupler 903 may comprise a memory controller. The graphics processing unit 901 may be configured to store data in the memory device 902. The graphics processing unit 901 may also be configured to retrieve data stored in the memory device 902. The device 900 may comprise further components not shown in FIG. 9. The device 900 may for example comprise one or more connectors or interfaces to connect the device 900 to other devices. The device 900 may for example comprise a connector to connect the device 900 to a main board of a computer.

The embodiments of the invention described in the foregoing description are examples given by way of illustration and the invention is nowise limited thereto. Any modification, variation and equivalent arrangement should be considered as being included within the scope of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. A memory device, comprising:
    a clock generating unit configured to generate a read clock signal, the clock generating unit being connected to a first clock signal contact configured to send the read clock signal, and the clock generating unit being connected to a first data signal contact configured to send data signals,
    wherein the memory device is configured to send the data signals in a phase and frequency accurate manner with regard to the read clock signal; and
    a second data signal contact configured to receive data signals.

2. The memory device according to claim 1, wherein the clock generating unit is configured to generate the read clock signal from a reference clock signal.

3. The memory device according to claim 2, wherein the clock generating unit is configured to regenerate the reference clock signal prior to generating the read clock signal.

4. The memory device according to claim 3, wherein the clock generating unit comprises a phase-locked loop.

5. The memory device according to claim 3, wherein the clock generating unit comprises a delay-locked loop.

6. The memory device according to claim 3, wherein the clock generating unit comprises a filter circuit.

7. The memory device according to claim 1, wherein the memory device comprise a graphics memory.

8. A memory device, comprising:
    a clock generating unit configured to generate a read clock signal, the clock generating unit being connected to a first clock signal contact configured to send the read clock signal, and the clock generating unit being connected to a first data signal contact configured to send data signals,
    wherein the memory device is configured to send the data signals in a phase and frequency accurate manner with regard to the read clock signal,
    wherein the clock generating unit is connected to a second clock signal contact configured to receive a write clock signal, and
    wherein the clock generating unit is configured to generate the read clock signal from the write clock signal.

9. The memory device according to claim 8, wherein the first data signal contact is further configured to receive data signals.

10. The memory device according to claim 8, wherein the clock generating unit is configured to regenerate the write clock signal prior to generating the read clock signal.

11. The memory device according to claim 10, wherein the clock generating unit comprises a phase-locked loop.

12. The memory device according to claim 10, wherein the clock generating unit comprises a delay-locked loop.

13. The memory device according to claim 10, wherein the clock generating unit comprises a filter circuit.

14. The memory device according to claim 8, wherein the memory device comprise a graphics memory.

15. A memory device, comprising:
    a clock generating unit configured to generate a read clock signal, the clock generating unit being connected to a first clock signal contact configured to send the read clock signal, and the clock generating unit being connected to a first data signal contact configured to send data signals,
    wherein the memory device is configured to send the data signals in a phase and frequency accurate manner with regard to the read clock signal, and
    wherein the clock generating unit is configured to generate the read clock signal from a reference clock signal; and
    a third clock signal contact that is configured to forward the reference clock signal to a further memory device.

16. The memory device according to claim 15, wherein the memory device comprise a graphics memory.

17. A memory device, comprising:
    a clock generating unit configured to generate a read clock signal, the clock generating unit being connected to a first clock signal contact configured to send the read clock signal, and the clock generating unit being connected to a first data signal contact configured to send data signals,
    wherein the memory device is configured to send the data signals in a phase and frequency accurate manner with regard to the read clock signal;
    a command and address signal contact;
    a repeater unit; and
    a repeater contact,
    the command and address signal contact being configured to receive a command and address signal, the repeater unit being configured to process the received command and address signal, and the repeater contact being configured to forward the processed command and address signal to a further memory device.

18. The memory device according to claim 17, wherein the memory device comprise a graphics memory.

19. A memory system, comprising a first memory device and a memory control device, the first memory device comprising:

a clock generating unit configured to generate a read clock signal, the clock generating unit being connected to a first clock signal contact configured to send the read clock signal, and the clock generating unit being connected to a first data signal contact configured to send data signals;

the memory control device comprising:
a second clock signal contact being connected to the first clock signal contact of the first memory device and being configured to receive the read clock signal sent by the first memory device; and
a second data signal contact being connected to the first data signal contact of the first memory device and being configured to receive the data signals sent by the first memory device, wherein the first memory device is configured to send the data signals in a phase and frequency accurate manner with regard to the read clock signal, and the memory control device is configured to sense the data signals synchronously to the received read clock signals.

20. The memory system according to claim 19, further comprising a second memory device, the first and second memory devices comprising a third and a fourth clock signal contact configured to receive a reference clock signal, wherein the memory control device comprises a fifth clock signal contact being connected to the third and fourth clock signal contacts of the first and the second memory device via a shared fly-by bus and being configured to send a reference clock signal.

21. The memory system according to claim 19, further comprising a second memory device, the first and second memory devices comprising a third and a fourth clock signal contact configured to receive a reference clock signal, wherein the memory control device comprises a fifth clock signal contact, being connected to the third clock signal contact of the first memory device and being configured to send the reference clock signal, and the first memory device comprises a sixth clock signal contact being connected to the fourth clock signal contact of the second memory device and being configured to forward the reference clock signal to the second memory device.

22. The memory system according to claim 19, further comprising a second memory device, the first and second memory devices comprising a first and a second command and address signal contact configured to receive a command and address signal, wherein the memory control device comprises a third command and address signal contact being connected to the first and second command and address signal contacts of the first and the second memory device via a shared fly-by bus and being configured to send a command and address signal.

23. The memory system according to claim 19, further comprising a second memory device, the first and second memory devices comprising a first and a second command and address signal contact configured to receive a command and address signal, wherein the memory control device comprises a third command and address signal contact being connected to the first command and address signal contacts of the first memory device and being configured to send a command and address signal, and the first memory device comprises a repeater contact being connected to the second command and address signal contact of the second memory device and being configured to forward the command and address signal to the second memory device.

24. The memory system according to claim 19, wherein the first memory device comprise a graphics memory.

\* \* \* \* \*